United States Patent [19]

Hullein et al.

[11] 4,240,069
[45] Dec. 16, 1980

[54] ANGLE CODER WITH VARIABLE INPUT ANGLE

[75] Inventors: François M. L. Hullein, Nantes; Jean-Claude A. M. Cadet, Nort S. Erdre, both of France

[73] Assignee: Societe d'Etudes, Recherches et Constructions Electroniques SERCEL, Carquefou, France

[21] Appl. No.: 952,210

[22] Filed: Oct. 17, 1978

[30] Foreign Application Priority Data

Oct. 20, 1977 [FR] France .................. 77 31615

[51] Int. Cl.³ .................. G08C 9/06; H03K 13/02
[52] U.S. Cl. .................. 340/347 P; 250/231 SE; 340/347 M; 356/141
[58] Field of Search .................. 340/347 M, 347 P; 250/231 SE; 356/141

[56] References Cited

U.S. PATENT DOCUMENTS

| | | |
|---|---|---|
| 2,901,170 | 8/1959 | Poole .................. 340/347 P |
| 3,930,201 | 12/1975 | Ackermann et al. .................. 328/63 X |
| 4,064,504 | 12/1977 | Lepetit et al. .................. 340/347 P |

Primary Examiner—Thomas J. Sloyan
Attorney, Agent, or Firm—Schwartz, Jeffery, Schwaab, Mack, Blumenthal & Koch

[57] ABSTRACT

An electronic angular coder for theodolites or the like, comprising a rotating disk bearing a series of engraved radial markings, a stationary detector, and a mobile detector. An approximate measure of the offset angle between a stationary detector and a mobile detector is accomplished by counting the markings passing in front of the heads. Fine measures of the shift in phase between the passage of a marking in front of the mobile detector and the fixed detector are also obtained.

12 Claims, 6 Drawing Figures

FIG_4

FIG_6

FIG._5

ANGLE CODER WITH VARIABLE INPUT ANGLE

BACKGROUND OF THE INVENTION

The invention concerns an electronic angle coder of the type comprising a rotating disk carrying a series of radial marks capable of being registered by detectors placed in front of the path of rotation of the marks engraved.

At least one reference detector is provided, together with at least one measuring detector, the latter being mobile in rotation around the axis of rotation of the disk. Such a coder may find an application for example in sighting telescopes or theodolites. The angle of rotation of the axis of the mobile measuring detector is to be measured with respect to a reference position represented by the position of the reference detector.

Double measurements are performed for the purpose of obtaining approximate measures and fine measures.

The approximate measure is obtained by counting the number of engraved marks registered by one of the detectors between the passage in front of the detector of a mark or a characteristic reference point of the rotating disc and the passage of the same mark or an associated mark in front of another detector. Such an approximate measure yields an angular value evaluated in the number of graduations of the disk located at any moment between the reference detector and the measuring detector.

The fine measurement consists of the additional determination of the exact supplemental angle of displacement between the two detectors when the total displacement does not correspond exactly to a whole number of intervals between succesive marks of the rotating disk. This fine measurement is performed by the determination by means of a numerical phase meter of the duration separating the passage of any radial mark in front of one of the detectors and the passage of a mark in front of the other detector after the first passage mentioned herein (preferably immediately after).

To improve the precision of the fine measurement, in view of possible errors in the regularity of the engraving of the marks of the rotating disk, the fine measure is taken for each passage of a mark in front of the reference detector, for a large number of consecutive marks (preferably over a complete rotation or several complete rotations of the disk), followed by the calculation of the average of the fine measures registered thus to derive a better approximation of the total fine measure; the calculation shows that engraving errors are practically eliminated if the average is calculated for a number of engraved consecutive marks as close as possible to the number corresponding to a complete rotation to a complete rotation (or several complete rotations).

A problem arises in connection with this averaging of the fine measures of phase displacement, when said phase displacement is close to 0 or to $2\pi$, i.e. when the two detectors (the reference and the measuring detectors) observe nearly simultaneousy in front of them a mark of the rotating disk and therefore their angular distance is a practically exact multiple of the angular interval between the two marks.

In effect, in such a case, where there are fluctuations of the spacing of the engraved lines, where the spacing is not absolutely perfect, there is a risk that the phase meter will measure a small positive angle for a first measure and an angle slightly less than $2\pi$ for the following measure, with the average of the values not yielding a value close to zero, as they should. For n number of measures, if the fluctuations cause the measure to pass k times to the other side of zero, the average fine measure calculated will be close to $2k\pi/n$ instead of zero, which is inadmissible.

This ambiguity of the values close to zero results from the fact that one phase measurement is by a $2\pi$ modulus and that a negative phase displacement close to zero will yield a positive indication close to $2\pi$.

SUMMARY OF THE INVENTION

The present invention has as its object the elimination of this ambiguity, by providing that the origin of the phase measurements is changed if the first fine measure of phase displacement indicates a value too close to 0 or to $2\pi$, the change in origin being intended to lend to the following measure or measures a value such that the amplitude of measuring fluctuations does not involve the risk of moving the new value beyond zero or $2\pi$.

In a preferred mode, if T is the duration separating the passage of two consecutive marks in front of a fixed reference detector (with T corresponding to a phase displacement of $2\pi$, and it is assumed that one signal period detected corresponds to the interval between two marks), the origin of the time measurements is displaced by T/2, if the first value measured indicates a phase displacement which is not comprised between T/4 and 3T/4. In contrast, the origin is left unchanged if the first value indicates a phase displacement comprised between T/4 and 3T/4. It may be considered, however, that the origin will be changed when the result of the first measure is not comprised between a fraction x and a fraction y of the period T.

It should be understood that this method of the elimination of the ambiguity around the zero phase is meaningful only when the measuring fluctuations (due specifically to imperfect engraving) do not attain the value of T/4, corresponding to a quarter of the interval between two consecutive marks.

It may be provided, for example that the displacement of the origin of times takes place forward if the first phase displacement measured is less than T/4 and backward if the first displacement is higher than 3T/4.

Further, it is advantageous to perform this test of the proximity of the 0 or the $2\pi$ phase for each measure, i.e. for all of the consecutive marks; it is then necessary to record the number and the direction of the various changes of the origin in order to include them in the calculation of the average. The importance of this permanent verification is particularly great in the case wherein it is desired to be able to perform measurements which are not static but dynamic, i.e. when the mobile detector has moved during the course of the measurement yet it is still desired that the coder produce an exact indication. The device according to the invention makes it possible to perform exact measurements even if the mobile detector continues to move after the completion of the approximate measurement and during the rest of the fine measurement.

In this manner, an angle coder with a variable input angle may be provided which finds application for example in pursuit systems.

For the displacement of the origin of the times, an arrangement with two diametrically opposed reference detectors and two measuring detectors also diametrically opposed with respect to the axis of rotation of the rotating disk may be used, by recording the displacement between one of the reference detectors and one or the other of the measuring detectors, according to whether the origin of the time measurements must be altered or not. It will be shown how the crossing, the permutation of diametrically opposed detectors makes it possible to perform the equivalent of a change of the origin of times by a demiperiod of the passage of engraved lines, by calculating the average of the displacement measured for the two pairs of detectors.

According to still another characteristic of the invention it is provided that the phase displacements between the signals emitted by the detectors (which observe the passage of the engraved lines) are measured by counting a clock frequency FH between the passage of a line in front of a reference detector and the subsequent passage of a line in front of a measuring detector, with the particular feature that the clock frequency is variable and controlled by the velocity of the rotation of the rotating disk, or more precisely by the estimated value of this velocity of rotation immediately prior to the intended measurement.

BREIF DESCRIPTION OF THE DRAWINGS

Other characteristics and advantages of the invention will appear during the course of the detailed description which follows hereinafter and which makes reference to the drawings attached hereto, wherein.

DETAILED DESCRIPTION OF THE PREFERRED EMBODIMENTS

Figure 1:
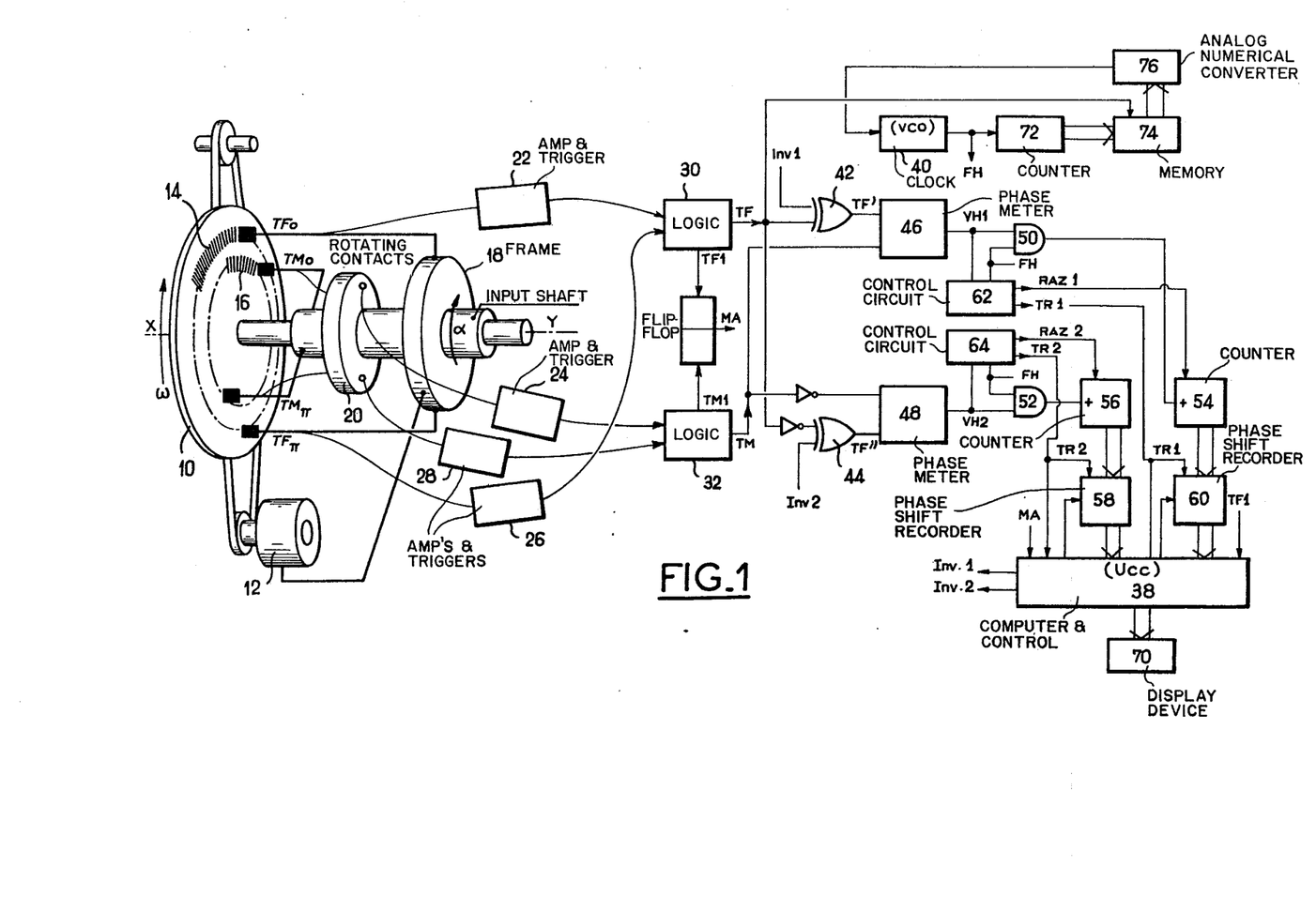
FIG. 1 represents a general diagram of the angle coder according to the invention.

FIG. 1 generally shows the entire angle coder according to the invention. The coder essentially comprises a disk 10 rotating at a constant velocity $\omega$, driven by a synchronous motor 12, supplied by a constant frequency alternating current.

The disc 10 carries a double row of radial reference lines consisting preferably of lines made of a light reflecting material, formed on a less reflective surface by means of photo engraving. These radial lines or engravings may thus be detected by optical detectors consisting essentially of a combination of an electroluminescent diode and a photodiode located facing a reading slit of a width approximately equal to that of the engraved lines; the slit is located in view of the rotating path of rotation of the engraved lines; depending on whether a reflecting engraved line is present in front of the slit, the photodiode receives or does not receive the light emitted by the electroluminescent diode. Optical readers of this type are known and will not be described in more detail, the essential fact being that they are capable of precisely recording the passage of the engraved line.

The rotating disk 10 comprises preferably two concentric tracks 14 and 16, each carrying the same numbers 2N of radial lines. Actually, the tracks comprise N engraved marks distributed periodically over a perimeter, with each mark consisting of two consecutive lines and the angular spacing interval of the marks amounting to $2\pi/N$; the use of a double line for each mark serves to facilitate the production of signals of detection. One of the tracks rotates in view of one or several stationary reading heads, the other in view of one or several mobile reading heads.

This particular arrangement is not absolutely necessary, since all of the reading heads may be placed in front of a single track, but it has the advantage that it enables the mobile reading heads to complete 360 degree rotations, which in this manner are not impeded by the presence of stationary heads on the same track.

Preferably, two stationary heads TFO and TF$\pi$ are provided with respect to the track 14 and diametrically opposed in regard to the axis xy of rotation of the disk 10, and in similar manner, two mobile heads TMO and TM$\pi$ are provided, said mobile heads being diametrically opposed with respect to the xy axis and placed in view of the track 16 of engraved lines. The mobile heads themselves are mounted rotatingly on a shaft rotating around the axis xy, which is also the axis of rotation of the disk 10. This arrangement of two groups of heads diametrically opposed to each other eliminates in a large measure any errors which may result from the imperfect coincidence of the axis of rotation of the disk and of the mobile heads, together with errors due to the fluctuation of the mean position of the axis of the disk.

The stationary reading heads are directly connected with an electronic measuring circuit carried by a stationary frame of the device (the frame is symbolically represented by the reference 18). The mobile heads are connected with the electronic circuit by means of a collector 20 having rotating contacts.

In a particular application to a theodolite, the stationary reading heads represent a reference position and the shaft carrying the mobile reading heads is integral with a sighting telescope. The measure of the angular offset between the mobile and stationary heads is an indication of the location or the position in height of a point sighted.

The angle is measured by means of a double operation, i.e. an approximate measure combined with a fine measurement.

To obtain an approximate measurement, the number of engraved marks present between a mobile measuring head and a stationary measuring head is counted.

For this purpose, each series of engraved radial lines which are spaced angularly in a regular manner on the disk, comprises a gap in a certain position, i.e. the absence of an engraved line in a place where such a line should exist in the regular series. This gap in the series of marks serves as a reference (one reference on each track, preferably essentially in the same angular position) for the approximate determination of the angular deviation between the detectors. Actually, in order to facilitate the detection of said gap, two consecutive engraved lines are omitted, i.e. one period will be missing of the N intervals of engraved marks (it will be recalled that each mark comprises two lines).

This mode of identifying the origin of the graduations on the disk makes it possible to eliminate an additional track with engraved marks of origin and two additional heads (one stationary and one mobile), with the corresponding electronic circuits, for the purpose of performing the approximate measurements from these reference marks.

The approximate measurements thus consist in registering the number of marks passing in front of a reading head beginning at the moment when a reference mark (absence of a line) of one of the tracks passes in front of one of the heads, to the moment when the reference mark absence of a line) of the other track passes in front of a reading head of the other track.

The electrical signals emitted by the different heads are formed by the circuits 22, 24, 26, 28, performing respectively for each head an amplifying function and a function of release (Schmitt trigger) to generate rectangular signals with steep leading and trailing edges, which indicate with a very high precision the moments of the onset and the end of the coincidence of the passage of each line in front of a reading head.

By means of a circuit 30 which receives the signals emitted by the stationary heads TF0 and TF$\pi$ and a circuit 32 which receives the signals of the mobile heads TMO and TM$\pi$, rectangular signals TF and TF1 on the one hand, and TM and TM1 on the other hand, are generated, respectively, whereby a fine and an approximate measure may be performed in view of the two diametrically opposed pairs of heads.

The TF signal is a rectangular signal with leading edges coincident with the leading edges of the rectangular signals emitted by the TF0 head and trailing edges coincident with the leading edges of the rectangular signals formed by the TF$\pi$ head. The TF signal has a period corresponding to the passing periods of the N marks of the disk (2N engraved lines, thus a period double that of the signals emitted by the TF0 and TF$\pi$ heads.

The TF1 signal is a pulse generated to record the passage in front of the TF0 head of the mark which consists of the absence of two engraved lines on the engraved track.

Figure 2:
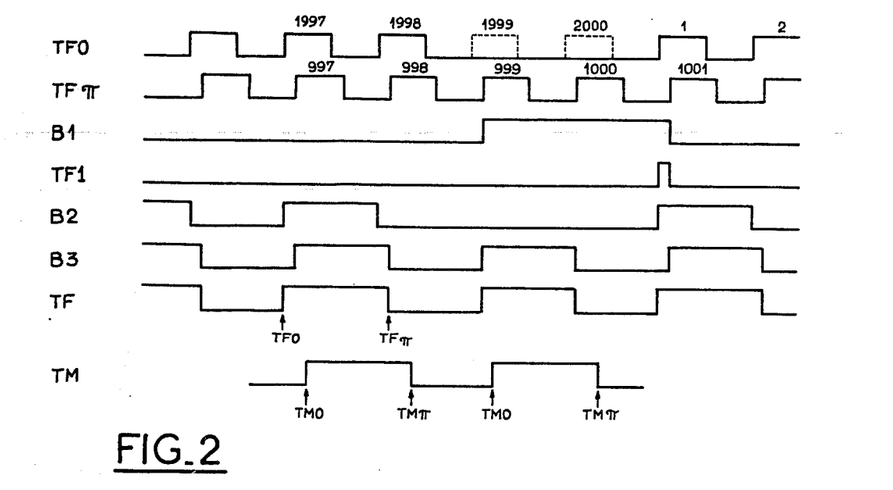
FIG. 2 represents the time diagram of detection signals produced by the diametrically opposed reading heads.
Figure 3:
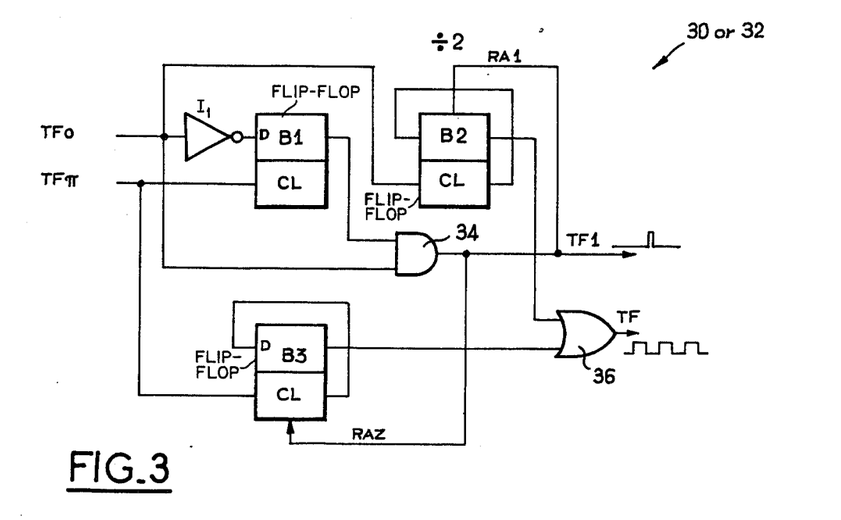
FIG. 3 represents a circuit diagram of the production of the signals shown in FIG. 2.

FIG. 2 shows a time diagram illustrating the generation of the TF and TF1 signals by the circuit 30, which is shown in more detail in FIG. 3. In the example of FIG. 2, it is assumed that each engraved track comprises a number 2N=2000 positions of engraved lines, two consecutive lines thereof being eliminated to constitute an initial reference mark. The lines omitted are numbered 1999 and 2000.

As seen in FIG. 2, the signals emitted by the head TF$\pi$, do not coincide exactly with those of the head TFO. This is the result of the fact that the two heads are not opposed to each other diametrically with absolute accuracy, because a slight offset (less than the spacing between two engraved lines) is desirable in order to avoid the coincidence of the leading or trailing edges of the signals emitted by the two heads. This offset must be the same for the heads TMO and TM$\pi$.

In FIG. 3, which describes the circuits 30 and 32 for the generation of the signals TF, TF1, TM and TM1, it is seen that the signal TFO is applied to a flip-flop B1 by means of an inverter I1, with the flip-flop B1 receiving also the TF$\pi$ signal through another input, so that the flip-flop delivers a signal of logic level 1 at the moment when TF$\pi$ passes to 1, only when TFO is at zero. This takes place only when the missing engraved lines are in front of the TFO head. AND gate 34 receives the output of B1 and TFO which appears at the moment of the passage of the first engraved line following the gap in the lines which marks the initial reference of the track 14.

On the other hand, the TF signals are generated in the following manner: a flip-flop B2 connected as a divisor by two, and receiving TFO, produces rectangular crests having half the frequency of the passage of the engraved lines, i.e. a frequency equal to that of the passage of N marks of the track 14. A flip-flop B3 performs a similar function for TF$\pi$ and an OR gate 36 combines the outputs of the flip-flops B2 and B3 and delivers a crest signal TF, at the frequency of the passage of the engraved marks in front of the stationary heads, the crests being reinstituted at the locations where a mark is obliterated.

With the exception of this location, the crests of TF display their leading edge at the instant of the leading edge of TFO and their trailing edge at the instant of the leading edge of TF$\pi$ (FIG. 2). At each pulse TF1, once during each rotation, the flip-flops B2 and B3 are reset to 1 and 0, respectively, to always re-institute the same configuration of the signals.

It should be understood that a signal TM and a signal TM1 are generated in exactly the same manner as TF and TF1 from a circuit 32 which is identical with the circuit 30, and which recieves signals from the heads TMO and TM$\pi$ in place of TFO and TF$\pi$.

Returning to FIG. 1, it is seen that the signals TF1 and TM1 (one pulse per rotation of the disk for each) are applied to a flip-flop MA, so that MA is placed at the logic level 1 by TF1 and returned to zero by TM1. The flip-flop MA thus provides a logic crest of a duration equal to the time interval separating the passage of the origin reference of the track 14 in front of the stationary head TFO and the passage of the origin reference of the track 16 in front of the mobile head TMO.

This crest is used to unblock a counter (in a computer and control unit 38), the counter being incremented by the crests essentially generated by the signals TF and TM as shall be described more completely hereafter. In this manner, the number of engraved marks passing in front of the heads TF and TM is counted during the duration of a crest; the result is an approximate measure of the angle separating the stationary reading head TFO from the mobile reading TMO (the measure is identical for the angle TF$\pi$, TM$\pi$). If the number of engraved lines is 2N-2 on each track (2N angular intervals initially and two consecutive missing lines) and if X is the number of crests of TM counted (TM having a period equal to two marks), the approximate angle measured is 400 X/N in grades ($2\pi$ X/N in radians).

Having executed the approximate measure in this manner by simply counting, a precise measure of the phase shift between the signals emitted by a stationary head and by a mobile head is made.

This measure is actually made with the signals TF and TM discussed hereinabove, with the shift in phase measured being that which exists between the logic transitions of TF and TM; this shift in phase is measured for each angular interval between two consecutive marks of an engraved track of the coder, i.e. for each period of the TF signal.

A phasemeter receives the rectangular, high frequency signals FH of a clock 40 during the intervals of time representing the phase shift to be measured. According to an essential characteristic of the invention the phase measurement is performed by changing the origin, if the result of the preceding measurement is too close to 0 or $2\pi$, in order to prevent fluctuations around zero due to irregularities of the engraving, which could introduce an unacceptable error during the averaging of the measurements, in view of the fact that the phasemeter does not differentiate between a slightly negative shift in phase and a phase shift close to $2\pi$.

In order to perform such a change of the origin, and thus to eliminate measuring fluctuations, phase shift measuring crests are produced wherein the pulses of the clock are counted, with the origin of the crests depending on the measure of the preceding phase:

the first phase measure consists essentially of generating a saw tooth series of counting the pulses of the clock between the leading edges of the TF and TM signals, if the results of the first measure yields a shift in phase comprised between $\pi/2$ and $3\pi/2$ (fractions of the period of the TF and TM signals), the measures of the phase of the following periods begin with the counting crests also at the intervals between the leading edges of the TF and TM signals, if the result of the first measure yields a shift in phase between 0 and $\pi/2$, the counting crests are generated beginning at a point located essentially a half period in advance of the leading edge of TF and up to the leading edge of TM, so that the phase shift counted in the following period is comprised between $\pi/2$ and $3\pi/2$, if the result of the first measure yield a phase shift between $3\pi/2$ and $2\pi$, the counting crests are generated beginning at a point essentially a half period behind the leading edge of TF and up to the leading edge of TM, so that during the following period a phase shift between $\pi/2$ and $3\pi/2$ is found.

In practice, as shall be seen hereinafter, instead of shifting the origin of the measure exactly by one half period, an edge of the logic transistion of TF in the direction opposite to the transition which has served as the point of departure for the preceding measure is taken as the point of departure of the following measure. It should be understood that for the measurement of the shift in phase to have a direction, it is necessary to know exactly the extent to which the origin of the measure has been advanced (and how many times this has been done, if it has been performed several times during one rotation of the disk), so that the result of the average produced by the phasemeter may be corrected correspondingly.

The fact that the device comprises two stationary and two mobile measuring heads diametrically opposed to each other, is utilized for this purpose (with, however, a slight angular offset, which is the same for both the stationary and the mobile heads and is intended to prevent the coincidence of the leading edges of the TFO and TF$\pi$), together with the fact that in order to correct the errors of the eccentricity of the rotating shafts, for each period of the TF signal the average must be formed of the measures of the phase shift between TFO and TMO, on the one hand, and between TF$\pi$ and TM$\pi$, on the other hand.

This average is equal to:

(TF0, TMO)+(TF$\pi$, TM$\pi$)/2;

wherein (TFO, TMO) represents the angular interval between the leading edges of TFO and TMO.

Normally, therefore, the shift in phase between the leading edges of the signals emitted by TFO and the signals emitted by TMO, are measured, i.e., between the leading edges of the TF and TM signals (see FIG. 2), to be added, for averaging, to the phase shifts between the leading edges of the signals issued by TF$\pi$ and those emitted by TM$\pi$, i.e. between the trailing edges of the TF and TM signals.

This will yield the measure of the average phase shift given between the diametrically opposed heads in each period of TF.

This measurement is performed directly in this manner (between the leading edges of TF and TM on the one hand, and between the trailing edges of TF and TM, on the other hand) during the first measure. The measurements are continued in the same manner when the phase shift measured is comprised between one quarter and three quarters of the period of the signal TF, i.e. when there is no risk that due to fluctuations it would become negative or greater than one period.

If, on the other hand, the shift in phase is comprised between 0 and one quarter of a period, or between three quarters of a period and one period, it is then possible to measure the phase shift between the leading edges of TFO and TM$\pi$ and, in order to obtain the average, add it to the phase shift between the leading edges of TF$\pi$ and TMO. In other words, the heads are crossed and it is noted that on the one part that the average measure obtained is the same as the preceding one with an additive term almost exactly equal to a half period. On the other part, the phase shifts between the crossed heads are comprised between one quarter and three quarters of a period and therefore there is no longer any risk that by means of their fluctuations they will pass between one period and the next from a positive value to a negative value, thus falsifying the measurement of the average shift in phase during one revolution of the disk.

In actual fact, the average value of the shift in phase obtained with the two pairs of crossed detectors is:

$$\frac{(TFO,TM\pi) + (TF\pi,TMO)}{2} = \tag{1}$$
$$\frac{(TFO,TMO) + (TMO,TM\pi) + (TF\pi,TM\pi) + (TM\pi,TMO)}{2}$$
$$= \frac{(TFO,TMO) + (TF\pi, TM\pi)}{2} + \pi$$

The same average measure of the shift in phase is thus obtained, within $\pi$ by crossing the detectors, with the advantage that if (TFO, TM$\pi$) and (TF$\pi$, TMO) are too close to zero or $2\pi$, then (TFO, TMO) and (TF$\pi$, TM$\pi$) are not, and vice versa. There exists therefore a way to avoid errors due to fluctuations.

The crossing of the detectors may be made once for all, following the measuring of the first period of TF (if the result of this first measurement indicates that it is necessary), or several times per revolution of the disk, by performing for each period a test aimed at determining if the result of the preceding period is close or not to 0 or to $2\pi$, and by crossing and decrossing the couples of the detectors each time, the phase shift measured exceeds the interval $\pi/2$ and $3\pi/2$.

The latter method makes it possible to perform exact measurements by taking into account not only the phase fluctuations due to engraving errors, but also of possible movements of the mobile detectors during the measurements. It is therefore now possible to use the coder in a system of pursuit.

The user now measures either the average of the phase shift between the leading edge of TF and that of TM and the average of the phase shift between the trailing edge of TF and of TM, (i.e. (TFO, TMO)+(TF$\pi$, TM$\pi$)/2), or the average phase shift between the leading edge of TF and the trailing edge of TM and the average of the phase shift between the trailing edge of TF and the leading edge of TM (i.e. (TFO, TM$\pi$)+(TF$\pi$, TMO)/2). The choice between the two measures depends on the result of the preceding measure.

For this purpose, a signal TF′ and a signal TF″ are produced, said signals being derived from the TF signal and the inversion control signals INV1 (for TF′) and INV2 (for TF″) so that if the inversion signal is at zero, TF′ and TF″ will merely reproduce TF and $\overline{TF}$ respectively, and if the inversion signal is at (ONE, TF′ or TF″ will present leading and trailing edges inversed with respect to TF and $\overline{TF}$, respectively.

The computer and control unit 38 thus produces (FIG. 1) a signal INV1 and a signal INV2 after every phase measurement. INV1 and INV2 pass to ONE only if the measure of the preceding phase indicates proximity with the phase 0 and $2\pi$ (in actual practice, if the phase measured is less than $\pi/2$ or is comprised between $3\pi/2$ and $2\pi$). The appearance of the signal INV1 at the ONE level takes place a quarter period after the start of the phase measurement, or three quarters of a period after, depending on the result of the phase shift measurement.

The INV2 signal is offset by a half period (of TF) from the INV1 signal.

An exclusive OR gate 42 receives TF and INV1 and produces TF′, which is equal either to TF or to $\overline{TF}$, depending on whether INV1=0 or 1.

An exclusive OR gate 44 receives $\overline{TF}$ and INV2 and produces TF″ which is equal to either $\overline{TF}$ or to TF, depending on whether INV2=0 or 1.

To summarize, the directions of the transitions of TF and $\overline{TF}$ are reversed by INV1 and INV2.

With TF′ and TM in an input circuit of the phasemeter 46, a signal VH1 consisting of crests commencing at the leading edge of TF′ and terminating at the leading edge of TM.

Similarly, from TF″ and $\overline{TM}$ in an input circuit of the phasemeter 48, identical to the circuit 46, a signal VH2 is produced consisting of crests commencing at the leading edges of TF″ and terminating at the leading edges of $\overline{TM}$.

The crests VH1 and VH2 serve to define the periods wherein the frequency of the clock FH is counted, in order to measure the phase shift. The average of the crests VH1 and VH2, which follow each other during a period of TF, is equal to the average phase shift measured on a pair of heads or on crossed couples, in this case with a corrective term equal to $\pi$.

Figure 4:
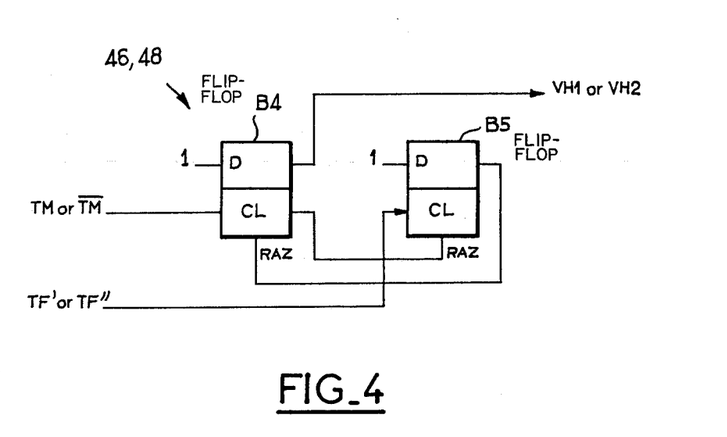
FIG. 4 represents a circuit diagram of the production of the counting crests of fine displacement between fixed and mobile heads.
Figure 5:
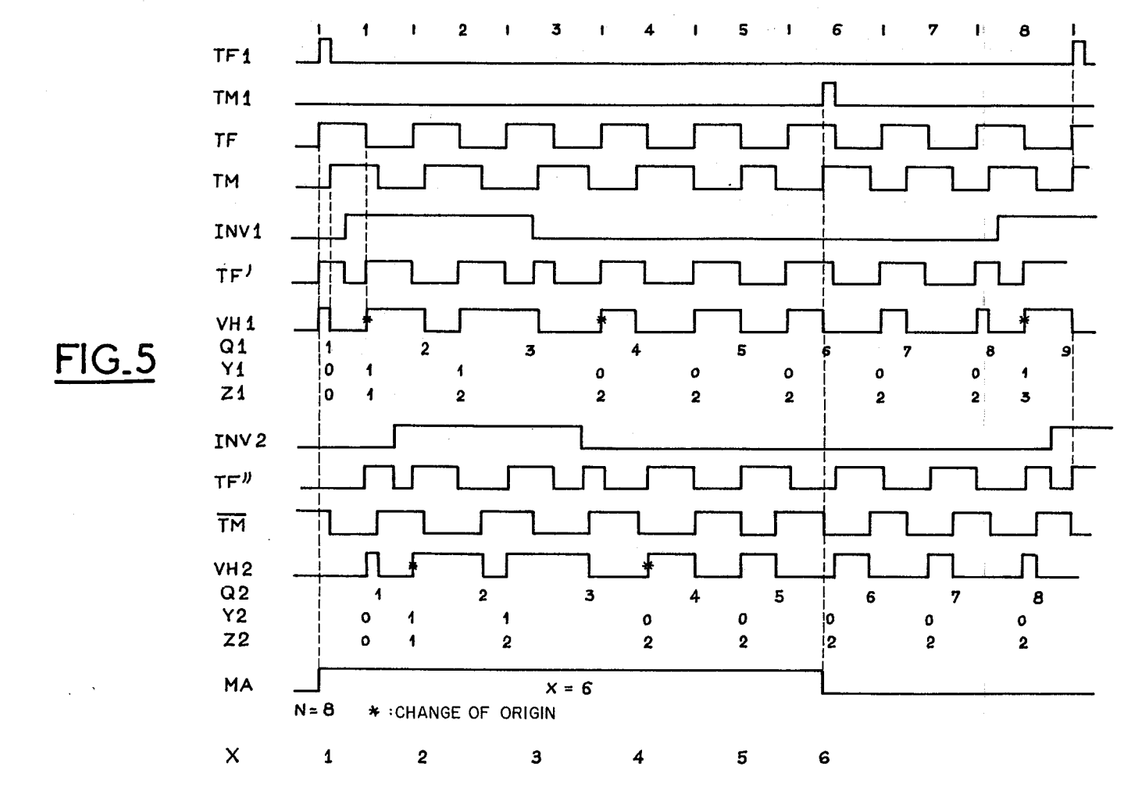
FIG. 5 represents a time diagram of signals contributing to the production of counting crests of fine displacement between reading heads.

The circuits 46 and 48 for the generation of the crests VH1 and VH2 are described in FIG. 4, while the forms of the signals obtained appear in FIG. 5, wherein a simplified example is given. For the sake of ease of representation in this figure the number N of engraved marks is limited to eight.

The circuits 46 and 48 each comprise two flip-flops B4 and B5, whereby one receives TM (or $\overline{TM}$ for the circuit 48) and the other TF′ (or TF″ for the circuit 48), said flip-flops responsive to the leading edges of the signals which they are receiving. The leading edge of TM (or $\overline{TM}$) triggers the termination of the crest VH1 (or VH2) at the output B4, while simultaneously it sets the flip-flop B5. The appearance of the leading edge of TF′ (or TF″) at the input of the flip-flop B5 changes state of the latter and triggers the resetting to zero of the flip-flops B4, thus starting the crest signal VH1 (or VH2) and resetting to zero the flip-flop B5 at the same occasion.

The crests VH1 and VH2 open AND gates 50 and 52, which also receive the clock frequency FH. The outlets of the AND gates are connected directly to the inlet of counters 54, 56, respectively, which constitute the essential part of the fine measuring phasemeter, so that the shift in phase is counted during the duration of the crests VH1 or VH2.

From the results of the pulse counting during the crests of VH1 and VH2, the control and computer unit 38 determines the measure of the average of the phase shifts during one turn of the rotating disk 10 (fine measurements), with the corrections imposed by changes in the origin of the phase, if such changes did take place. The computer and control unit 38 also determines the approximate measure of the shift in phase as explained hereinabove. The sum of the fine and approximate masurements yield the exact value of the average in time of the angle sought over a turn or several turns of the rotating disk 10.

The phase shift recorders 58 and 60, having parallel inlets and serial outlets, are placed between the counters 54 and 56 and the unit 38. They temporarily store in their memory the number of pulses received during each crest VH1 and VH2 and furnish to the computer unit (for averaging) the number counted at each indentation.

The control circuits 62 and 64 are provided to trigger the transfer of the contents by means of the computer unit of the recorders 58 and 60 to said computer unit, and to trigger the transfer of the contents of the counters 54 and 56 to the recorders 58 and 60 (transfer signals TF1 and TF2) generated by the circuits 62 and 64), together with the resetting to zero of the counters (signals RAZ1 and RAZ2).

The signals TF1 and RAZ1, generated by the circuit 62 which receives VH1 and the clock frequency FH, appear after each crest of VH1. The signals TR2 and RAZ2, generated by the circuit 64 which receives VH2 and FH, appear after each crest of VH2.

Figure 6:
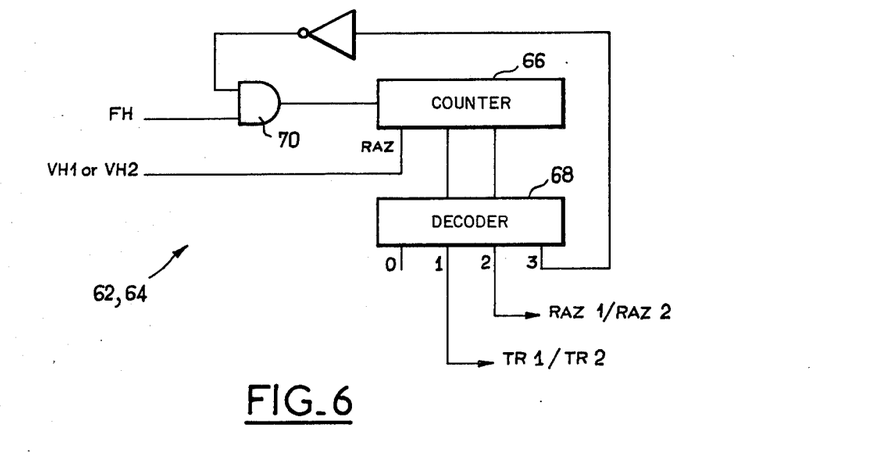
FIG. 6 represents the counter control and memory recording circuit of fine displacement at each passage of the mark in front of a mobile head.

The circuits 62 and 64 are described more precisely in FIG. 6. They utilize the clock frequency FH which is much higher than the frequency of the crests VH1 or VH2 to establish signals TF and RAZ which succeed one another (RAZ having to follow TR) at the end of each crest VH1 or VH2. This is accomplished by means of a four state counter 66, which is maintained at zero by VH1 (or VH2 for the circuit 64) and which, when released by the disappearance of VH1, is incremented three times by the clock frequency FH, with the fourth state of the counter, marked by a decoder 68 connected with said counter, initiating the blocking of the arrival of FH, by means of an AND gate 70, which receives FH together with the complement of the corresponding output of the decoder (the output which marks the fourth state of the counter).

The first and the second increment of the counter 66 are causing successively, at the corresponding outlets of the decoder 68 the appearance of the signals TRL and RAZ1 (or TR2 and RAZ2) of the period of one pulse of the clock, with TR1 always preceding RAZ1.

The computer and control unit 38 contains an adder to form the sums of W1 and W2 of the numbers counted during the crests VH1 and VH2 in the course of one complete rotation or several rotations of the disk 10. It comprises in addition, for the calculation of the approximate measure of the angle, a recorder of the count of a number X representing the number of the crests VH1 which appear between the signals TF1 and TM1, i.e. while the output signal of the balance MA (FIG. 1) is at ONE.

In practice, the record of the number X is increased, while MA=1 (as shown in FIG. 5), by the signal TR1 which is generated immediately after each crest VH1. The number X is always equal to the number of crests of TM which appear between the passage of the signal of origin TF1 before the stationary head TFO and the signal of origin TM1 in front of the mobile head TMO, because the end of each crest TM coincides with the end of a crest of VH1.

The computer and control unit 38 comprises additional recorders for counting the number of changes or the origin of phases performed during fine measurements to correct the average value of said measure in an appropriate manner.

A recorder of the number Q1 increased by the appearance of every signal TR1 (at the end of counting crest VH1), is provided to count during a complete rotation of the disk (between two TF1 signals) the number of fine measurements of phase shifts performed beginning with VH1.

Similarly, another recorder counts the number Q2 of fine measurements performed beginning with VH2.

The numbers Q1 and Q2 serve to form the average of fine measurements over one rotation; if W1 and W2 are phase shifts added by the computer unit, the average will be ½ (W1/Q1+W2/Q2). Q1 and Q2 are not necessarily equal to N, if the mobile heads move during the measurement.

Recorders are also provided for the recording of the number of times the crests VH1 are set from an origin advanced in phase by $\pi$ over the leading edge of TF and the corresponding number for the VH2 crests. For this purpose, a number Y1 is raised from a memory, which after being introduced with the value of zero at the beginning of the measurement, i.e. at the appearance of TF1, is increased by 1 whenever the duration of a crest VH1 becomes less than a fourth of the period of TF and decreased by 1 if the duration of VH1 exceeds three-fourths of a period. The same disposition is provided for Y2 as a function of the duration of VH2. Comparators receiving the output of the buffer recorders 58 and 60 are provided in the control unit to test the duration of the crests and to process the pulses increasing or decreasing Y1 and Y2 (the comparators also serve to generate the phase inversion command signals INV1 and INV2).

The number Y1 is added to a recorder Z1 which accumulates the values of Y1 at the onset of crest of VH1. The same is true for Z2, so that at the end of a rotation of disk, Z1 and Z2 represent the numbers whereby a correction may be made, by the formula given hereinbelow, accounting for the various changes in the origin of the phase (advance or retardation by $\pi$).

The entirety of the numbers recorded in the various recording units of the computer and control unit 38 is used to finally produce an accurate measure of the constant or variable angle of rotation between the stationary reading head TFO and reading head TMO. This total measure, the approximate measure plus the fine measure, may be expressed as follows:

$$\alpha \text{ (grades)} = \underbrace{\frac{100}{\pi} \frac{\omega}{FH} \left( \frac{W1}{Q1} + \frac{W2}{Q2} \right)}_{\text{fine measurement}} - \underbrace{\frac{2 \times 10^2}{N} \left( \frac{Z1}{Q1} + \frac{Z2}{Q2} \right)}_{\substack{\text{correction of} \\ \text{changes in} \\ \text{origin}}} + \underbrace{\frac{400 \, X}{N}}_{\substack{\text{approxi-} \\ \text{mate} \\ \text{measure}}}$$

wherein:
2N: number of engraved lines
$\omega$: angular velocity of the rotating disk in radians/s
FH: clock frequency The measure $\alpha$ is used or displayed on a device 70.

The equation applied takes into account the changing of the origin of the phase in one direction or the other. It provides an exact total measure, even if the entrance angle of the coder varies by several scale graduations between the moment of the acquisition of X and the rest of the rotation of the rotating disk 10.

The comparators serving to produce the signals INV1 and INV2 and to increment the counters Y1, Y2, Z1, Z2 may be designed so as to be activated by the signals TR1 and TR2 which are produced after each crest VH1 or VH2; it is possible, for example, to produce a signal modifying the inversion signal if following the appearance of the signal TR1 the contents of the counters 54 and 56 is less than T/4, or from the instant when the content of the counters passes above T/4.

The numerical values chosen for the parameters of the coder depend on the type of instrument to be designed, a slow or rapid coder.

For a slow coder, a relatively limited rotational velocity may be chosen: for example 2.5 revolutions per second with 2000 engraved lines (less two for the marking of the origin) and a clock frequency of 1 MHz. However, it is also possible to greatly increase the velocity of the rotating disk, for example to 100 rotations/second, with the condition of selecting a sufficiently high clock frequency (10 MHz, for example). The advantage here is that the coder is able to function even if the entrance angle of the coder (the angle of the shaft bearing the mobile detectors) varies strongly during the course of the measurements. In fact, the principle adopted has the effect that the measure is precise even if the entrance angle varies practically at a rate of variation equal to one fourth of the velocity of rotation of the disk. Further, it should be noted that the errors due to the angular acceleration of the entrance shaft of the coder are greatly reduced for a rapidly rotating coder because said errors are inversely proportional to the square of the angular velocity of the rotating disk.

According to another important characteristic of the invention, provisions are made to associate the frequency FH of the counting clock with the velocity of rotation of the rotating disk, so that the measurement of the shift in phase by the counting of clock pulses will be truly and effectively a measure of phase and not merely a measure of duration. In fact, if for a given constant clock frequency the velocity $\omega$ of the rotation of the disk would vary, the result of the counting would not be representative of a true measurement of phase and introduce an error generally higher than the error introduced by the irregularities of the engraving.

Consequently, an oscillator with a frequency controlled by a voltage, 40, is provided to establish the frequency of the counting clock FH. The frequency FH is controlled by the period of TF, i.e. practically by the velocity of rotation of the disk, within the error of the engraving.

A counter 72 receives the frequency of the clock and sums the number of FH pulses received during a TF period. The outlet of the counter is connected with a memory 74, which receives, as a signal of instruction to record the contents of the counter, the TF signal. The outlet of the memory is connected with an analog numerical converter 76, which produces a control voltage of the variable frequency oscillator 40. The response time of this control circuit is very rapid and the phase measurement thus takes into account in each TF period the velocity of rotation of the disk measured during the period, which practically eliminates any error due to the fluctuation of said velocity, if the reasonable assumption is made that these fluctuations are negligible from one mark to the next on the engraved disk.

We claim:

1. In an angular coder of the type comprising a rotating disk bearing a series of regular angularly spaced radial markings capable of being detected by at least one stationary reference detector, and a mobile measuring detector mounted on a rotatable shaft having an axis coaxial to the axis of rotation of the disk, the detectors facing the path of the rotating radial markings, said coder comprising means for measuring the angular offset between the detectors, said means comprising means for measuring a first time interval which is the time interval separating the passage of a marking in front of one of the detectors and an immediately subsequent passage of a marking in front of another detector, the improvement comprising:
means for measuring a second time interval which is the time interval separating the passage of a substantially middle point between two successive markings in front of a detector and the immediately subsequent passage of a marking in front of another detector,
means for determining whether a time interval measured has a value between one fraction x and another fraction y of the duration separating the passage of two consecutive markings in front of a detector,
means responsive to said determining means for recording either the first or second time interval according to the determination made,
means for repeating the measurement and recording of the first or second time interval for successive markings passing in front of said one detector, and
means for calculating an average of the successive recorded measurements.

2. A coder according to claim 1 wherein said determining means are capable of effecting a determination for each time interval measured and recorded and wherein the means for recording the first or second time interval respond to said determining means so as to record the second, respectively the first, time interval if the determining means indicate that the first, respectively the second, time interval previously measured and recorded is not comprised between fraction x and fraction y.

3. An angular coder according to claim 1 wherein $x=\frac{1}{4}$ and $y=\frac{3}{4}$.

4. A coder according to claim 2, wherein said recording means respond to the determining means in such a way that, in case one time interval, that is the first or the second respectively, is measured and found to be less than fraction x or more than fraction y, the other time interval, that is the second or first respectively, is then recorded next, said other interval having an origin later than the end of the previously measured one time interval.

5. A coder according to claim 1, wherein the detectors supply a substantially symmetrical rectangular wave form and wherein means are provided for inverting the phase of the signal issued by a detector, said inverting means responding to the determining means for maintaining or inverting the phase according to whether the time interval previously recorded is comprised or not between fractions x and y.

6. A coder according to claim 1 wherein the time intervals are measured by counting pulses of a high frequency clock during said time intervals.

7. A coder according to claim 6, wherein the frequency of the clock is proportional to the velocity of rotation of the rotating disk.

8. A coder according to claim 7, wherein said clock includes a controlled frequency oscillator for producing the clock frequency, a counter receiving the clock frequency during period corresponding to an interval between the passages of two markings in front of a stationary detector, and a numerical-analog converter connected with the oscillator to control the frequency of said oscillator as a function of the counting at the end of each interval between the passage of two markings in front of a detector.

9. An angular coder comprising a rotating disk bearing a series of regular angularly spaced radial markings capable of being detected by at least two stationary reference detectors, and two mobile reference detectors mounted on a rotatable shaft having an axis coaxial to the axis of rotation of the disk, the detectors facing the path of the rotating radial markings, the two stationary detectors being approximately diametrically opposed and the two mobile detectors being also approximately diametrically opposed, said coder comprising:
first measuring means for measuring a first time interval separating the passage of a marking in front of one stationary (respectively mobile) detector and an immediately subsequent passage of a marking in front of a mobile (or respectively stationary) detector, said measuring means being capable of receiving signals from the corresponding detectors,
second measuring means for measuring a second time interval separating the passage of a marking in front of the other stationary (or respectively mobile) detector and an immediately subsequent passage of a marking in front of a mobile (or respectively stationary) detector, said means being couplable to the corresponding detectors for receiving signals from them,
means for recording the mean value of the first and second time intervals measured with all four detectors,
means for determining whether a recorded mean value is comprised or not between a fraction x and a fraction y of the period of time separating the passage of two successive markings in front of a detector,
means, responsive to said determining means for effecting a permutation of the mobile (or respectively stationary) detectors coupled to the first and second measuring means when the determining means indicate that a recorded value is not comprised between fractions x and y, means for repeating said measurings and recordings for successive markings passing in front of the stationary (respectively mobile), detector and means for computing an average of the successive recorded values.

10. A coder according to claim 9 further comprising means for recording the number of times the said permutation has been effected during a given number of measures and for entering this number in the computing means for effecting a correction of the mean value of the successive values.

11. A coder according to claim 9 wherein the determining means effects the determination for each recorded value.

12. A coder according to claim 9 wherein $x = \frac{1}{4}$ and $y = \frac{3}{4}$.

* * * * *